(12) United States Patent
Ito et al.

(10) Patent No.: US 6,906,368 B2
(45) Date of Patent: Jun. 14, 2005

(54) MAGNETIC RECORDING MEDIUM AND MAGNETIC MEMORY APPARATUS

(75) Inventors: Kenchi Ito, Sendai (JP); Jun Hayakawa, Sendai (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/670,216

(22) Filed: Sep. 26, 2003

(65) Prior Publication Data

US 2004/0062097 A1 Apr. 1, 2004

(30) Foreign Application Priority Data

Sep. 26, 2002 (JP) ........................................ 2002-280153

(51) Int. Cl.$^7$ ............................................ H01L 31/062
(52) U.S. Cl. ................ 257/295; 257/421; 257/E27.006
(58) Field of Search ........................ 257/421, E27.006, 257/295; 360/135

(56) References Cited

U.S. PATENT DOCUMENTS

| | | | |
|---|---|---|---|
| 5,360,748 A | | 11/1994 | Nadahara et al. |
| 5,734,605 A | | 3/1998 | Zhu et al. |
| 6,034,887 A | * | 3/2000 | Gupta et al. ................. 365/171 |
| 6,665,258 B1 | * | 12/2003 | Dietzel et al. ............... 369/126 |
| 2002/0158342 A1 | * | 10/2002 | Tuominen et al. .......... 257/784 |
| 2003/0001274 A1 | * | 1/2003 | Den et al. .................... 257/761 |

FOREIGN PATENT DOCUMENTS

JP          5-206146          8/1993

OTHER PUBLICATIONS

Takano et al., "Recording Systems I: Mostly Perpendicular," *IBM Storage Systems*, Session CA, Jan. 9, 2001, Abstracts, pp. 131, 132, IBM, San Jose, CA.

Katine et al., "Current–Driven Magnetization Reversal and Spin–Wave Excitations in Co/Cu/Co Pillars," The American Physical Society, Vo,. 84, No. 14, Apr. 3, 2000. pp. 3149–3152.

Lutwyche et al., "Highly parallel data storage system based on scanning probe arrays," American Institute of Physics, vol. 77, No. 20, Nov. 13, 2000, pp. 3299–3301.

* cited by examiner

*Primary Examiner*—David Nelms
*Assistant Examiner*—Tu-Tu Ho
(74) *Attorney, Agent, or Firm*—Antonelli, Terry, Stout & Kraus, LLP

(57) ABSTRACT

Disclosed is a magnetic memory apparatus which comprises a patterned magnetic recording medium in which multilayered films each having a first magnetic layer, a nonmagnetic metal layer or a nonmagnetic insulating layer and a second magnetic layer deposited discretely on a conductive electrode layer formed on a substrate, and a cantilever array having a plurality of cantilevers each having a conductive chip at its distal end. This provides a magnetic solid memory apparatus that has a large memory capacity and a super fast transfer rate, the merits of a hard disk apparatus, and a nanostructure and low power consumption, which are the merits of a semiconductor memory.

14 Claims, 7 Drawing Sheets

MAGNETIC RECORDING MEDIUM AND MAGNETIC MEMORY APPARATUS

BACKGROUND OF THE INVENTION AND RELATED ART STATEMENT

1. Field of the Invention

The present invention relates to a magnetic recording medium and a magnetic memory apparatus using the same, and, more particularly, to a pattern type magnetic recording medium having multilayered nanostructures having a magnetoresistance effect laid out discretely and a magnetic memory apparatus which writes and reads information from the recording medium using a cantilever array.

2. Description of the Related Art

The surface recording density of magnetic disk apparatuses is ever increasing and is expected to reach 100 gigabits per inch in 2003. The present in-plane recording system, however, has a problem that as the bit length to write becomes shorter, magnetic signals written on a recording medium are vanished by thermal fluctuation, which stands in the way of increasing the surface recording density. Attention is paid to a perpendicular recording system which writes magnetic signals in a direction perpendicular to the recording medium as a solution to this problem. In particular, as the perpendicular recording system which uses a perpendicular recording medium having a soft-magnetic backing layer as a recording medium and uses a single-pole head to write information has a high resistance to a thermal fluctuation and can generate a strong recording magnetic field, the perpendicular recording system is a promising future perpendicular recording system for super high density.

For example, FD-08 in the 8th Joint MMM-Intermag Conference held at San Antonio in America in January 2001 has reported perpendicular recording with a surface recording density of 60 gigabits per square inch (see Non-patent Document 1).

In the perpendicular recording system, as recording bits become smaller as the surface recording density increases, the area of the floating surface of the single-pole head to be used in writing information which faces a magnetic recording medium should be made smaller. As the area of the floating surface of the single-pole head is reduced, however, the intensity of the magnetic field that can be generated is reduced in inversely proportional to that area. This results in insufficient recording. A first solution to this shortcoming is to increase the saturation magnetic flux density Bs of the magnetic substance that constitutes the single-pole head. As the theoretical limit of the saturation magnetic flux density Bs of the magnetic substance is 3.0 tesla, which is merely 1.5 times the theoretical limits of materials available at present and cannot cope with the future higher density.

The conventional magnetic recording has been done by inverting the magnetization of a magnetic recording medium using the magnetic field generated by the induction type magnetic head which floats and runs over the magnetic recording medium. A recent magnetic random access memory (MRAM) which is a possible substitute for the conventional dynamic random access memory (DRAM) employs a recording system which inverts the magnetization of one of tunneling magnetoresistance effect (TMR) elements having a multilayered structure of a magnetic film/non-magnetic insulating film/magnetic film by using a combined magnetic field formed by the current that runs through two metal lines laid on and under this TMR element, perpendicular to each other (see, for example, Patent Document 1: U.S. Pat. No. 5,734,605). It is however pointed out that the MRAM has a shortcoming that as the size of TMR elements is made smaller for larger memory capacity, the size of the magnetic field needed to invert magnetization becomes larger, requiring that a lot of current should flow through the metal lines. This leads to an increase in power consumption and eventually damages the lines. Those facts suggest that the magnetic disk apparatus as well as the MRAM suffer limitation to increasing the density as long as the magnetization inversion system using a magnetic field is employed.

As a scheme of inverting magnetization without using a magnetic field, a magnetic recording system has been proposed which makes magnetic recording by causing the current to flow to a magnetic recording medium from a probe having a conductive chip and heating the portion where the current has run (see, for example, Patent Document 2: Japanese Patent Laid-Open No. Hei 5-206146).

There is an empirical report on a recording system which forms pillars of 130 nm in diameter each including a multilayered film of Co/Cu/Co between two Cu electrodes and inverts the magnetization of the Co layer by letting the current flow in the pillars (see, for example, Non-patent Document 2: Physical Review Letters, Vol. 84, No. 14, pp. 3149–3152 (2000)).

Several ideas of constructing a super high density writing/reading apparatus without using magnetic recording have also been proposed. One of the proposed ideas is a recording system which uses an array of 32×32 cantilevers 102 each having a heater formed at its distal end and polycarbonate and makes recording by heating the heater at the distal end of a cantilever and pressing the heater against the polycarbonate to deform the polycarbonate, thereby forming holes therein (see, for example, Non-patent Document 3: Applied Physics Letters, Vol. 77, No. 20, pp. 3299–3301 (2000)).

The conventional proposals however have the following problems.

In the system that makes magnetic recording by causing the current to flow to a magnetic recording medium from a probe and heating the current-flown portion, for example, magnetic recording is done by the Joule heat of the supplied current, so that the inversion of magnetization takes time. The system cannot therefore ensure as fast recording as achieved by the conventional magnetic disk apparatus and MRAM.

The recording system that forms pillars of 130 nm in diameter each including a multilayered film of Co/Cu/Co and inverts the magnetization of the Co layer by letting the current flow in the pillars requires a current density of about $3 \times 10^7$ (A/cm$^2$) for recording. In case where such a large current is provided from the metal lines of the conventional MRAM, therefore, the current density that even lines of a tungsten-based material which has a large durability to the current can withstand is about $1 \times 10^7$ (A/cm$^2$) so that the cross-sectional area of the lines cannot be made smaller than a 150-nm square. This stands in the way of increasing the density. In addition, because the system requires that a current of a high current density should run through long lines, the system has a reliability problem.

As the system that makes recording by heating the heater at the distal end of a cantilever and pressing the heater against polycarbonate to deform the polycarbonate and form holes therein also uses heat and suffers a slow writing speed of several tens of microseconds. While this prior art proposes a way of increasing the writing speed by parallel writing with a total of 1024 cantilevers, the writing speed of each cantilever is slow which, it seems, makes it very hard to achieve the fast recording done by the magnetic disk apparatus.

OBJECT AND SUMMARY OF THE INVENTION

Accordingly, it is an object of the invention to overcome the aforementioned problems using the following means.

A magnetic memory apparatus comprising:

a patterned magnetic recording medium in which multilayered nanostructures each having a first magnetic layer, a nonmagnetic metal layer or a nonmagnetic insulating layer and a second magnetic layer laminated in that order on a conductive electrode layer formed on a substrate are laid out apart from one another at substantially even pitches; and a cantilever array in which cantilevers having conductive chips at distal ends are laid out in an array and apart from one another in such a way as to be associated with the nanostructures, whereby information is written or read by a current supplied from that one of the conductive chips which is associated with a desired one of the nanostructures as that conductive chip is put in contact with the desired nanostructure.

Particularly, the magnetic recording medium may further comprise means for fixing the direction of magnetization of one of magnetic layers constituting the multilayered film showing a tunneling magnetoresistance (TMR) effect or the multilayered film showing a giant magnetoresistance (GMR) effect, e.g., the first magnetic layer or the second magnetic layer, to one direction. In particular, an antiferromagnetic film is used as the fixing means.

Further, as a magnetic recording medium, a patterned magnetic recording medium is used in which multiple nanostructures each comprising a multilayered film having a lamination of a multilayered film showing a TMR magnetoresistance effect and a multilayered film showing a GMR effect are surrounded by insulators in such a way as to be laid out apart from one another at substantially even pitches and are provided on a conductive electrode layer formed on a substrate. Particularly, it is suitable to form the multilayered film showing both the TMR effect and GMR effect by laminating a first magnetic layer, a nonmagnetic electrode layer, a second magnetic layer, a nonmagnetic insulating layer and a third magnetic layer in that order, and use the second magnetic layer both in the TMR effect multilayered film and the GMR effect multilayered film. Further, the magnetic recording medium may further comprise means for fixing the direction of magnetization of the third magnetic layer to one direction. Furthermore, an antiferromagnetic film is used as the means for fixing the direction of magnetization to one direction.

In the above-described magnetic memory apparatus of the present invention, digital information is written by inverting magnetization with 1 being a state where a resistance of the multilayered film is high while 0 is a state where the resistance is low, using a current supplied from that one of the conductive chips which is associated with a desired one of the nanostructures (pillars) as that conductive chip is put in contact with the desired nanostructure. Further, a signal is read by causing a current whose value is smaller than that of a current by which magnetization of the multilayered film is inverted to flow from the conductive chip and detecting the level of the resistance of each multilayered pillar.

DETAILED DESCRIPTION OF THE PREFERRED EMBODIMENTS

Figure 1A:
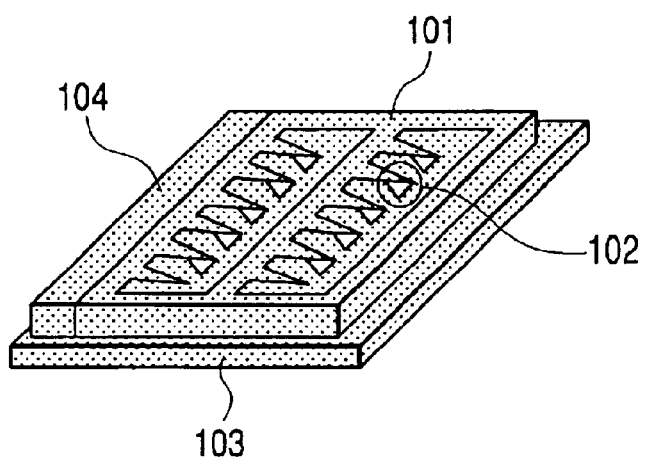
FIG. 1A is a perspective view showing the schematic general structure of one example of a magnetic memory apparatus embodying the present invention.
Figure 1B:
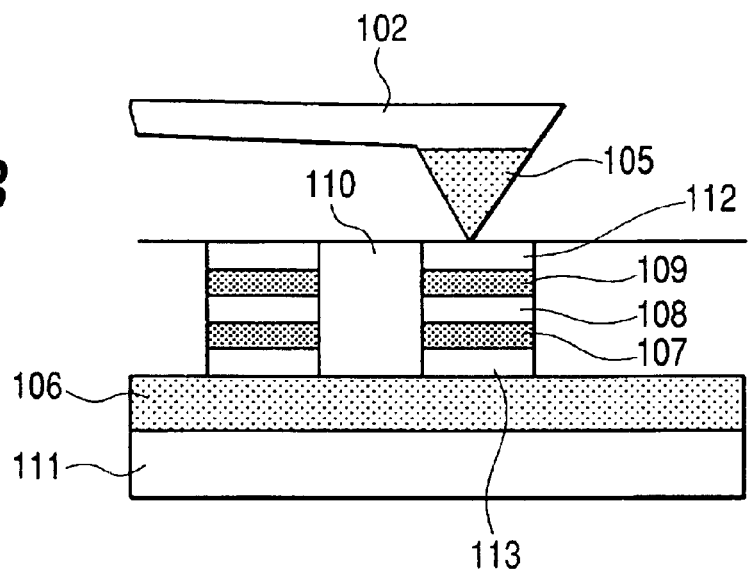
FIG. 1B is a diagram showing one cantilever in FIG. 1A and a part of a magnetic recording medium in enlargement.
Figure 1C:
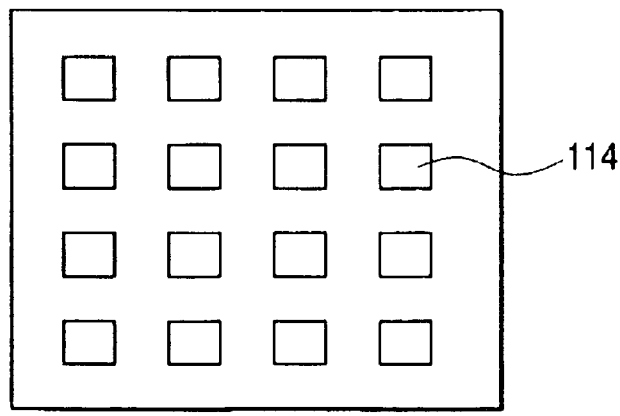
FIG. 1C is a schematic plan view of the magnetic recording medium.

Preferred embodiments of the present invention will be described below with reference to the accompanying drawings. FIGS. 1A to 1C show one example of a magnetic memory apparatus according to the invention. FIG. 1A is a perspective view showing the schematic general structure of the magnetic memory apparatus according to the invention, FIG. 1B is a diagram showing one of cantilevers of the magnetic memory apparatus and a part of a magnetic recording medium in enlargement, and FIG. 1C is a plan view showing the schematic structure of the magnetic recording medium.

In FIGS. 1A to 1C, "101" is a cantilever array, "102" denotes cantilevers, "103" is a magnetic recording medium, "104" is a cell selection/signal processing section, and "105" is a conductive chip portion. Further, "106" is a conductive electrode layer, "107" is a first magnetic layer, "108" is a nonmagnetic metal layer or nonmagnetic insulating layer and "109" is a second magnetic layer.

Each multilayered film which is the lamination of the layers 107, 108 and 109 (hereinafter referred to as "lamination of 107, 108 and 109") constitutes a pillar-like nanostructure (hereinafter referred to as "pillar") 114. Those multilayered pillar-like nanostructures 114 are laid out apart from one another at substantially even pitches as shown in FIG. 1C. "110" denotes an insulating portion formed between the pillars 114, "111" is a substrate, "112" is a magnetic cap layer and "113" is a magnetic base metal. In FIG. 1C, "114" indicates a single pillar.

The materials for the two magnetic films indicated by "107" and "109" can be selected from Co, Fe, Ni and their alloys. In case where "108" is a nonmagnetic metal layer, the lamination of 107, 108 and 109 constitutes a multilayered pillar which demonstrates a giant magnetoresistance (GMR) effect and Cu, for example, is a desirable material for this nonmagnetic metal layer. In case where "108" is a nonmagnetic insulating layer, the lamination of 107, 108 and 109 constitutes a multilayered pillar which demonstrates a tunneling magnetoresistance (TMR) effect and an oxide containing an element, such as Al, Ta, Mg, Hf or Zr, or a nitride containing an element, such as Al or Ti, can be used as the material for this nonmagnetic insulating layer.

It is to be noted that FIGS. 1A to 1C illustrate the schematic structure of the cantilever array and patterned magnetic recording medium which are used in the invention and the numbers of the cantilevers and the multilayered pillars both illustrated are omitted, not to mention that the magnifications of FIGS. 1A to 1C are not the same. The same is true of the other diagrams.

Figure 2:
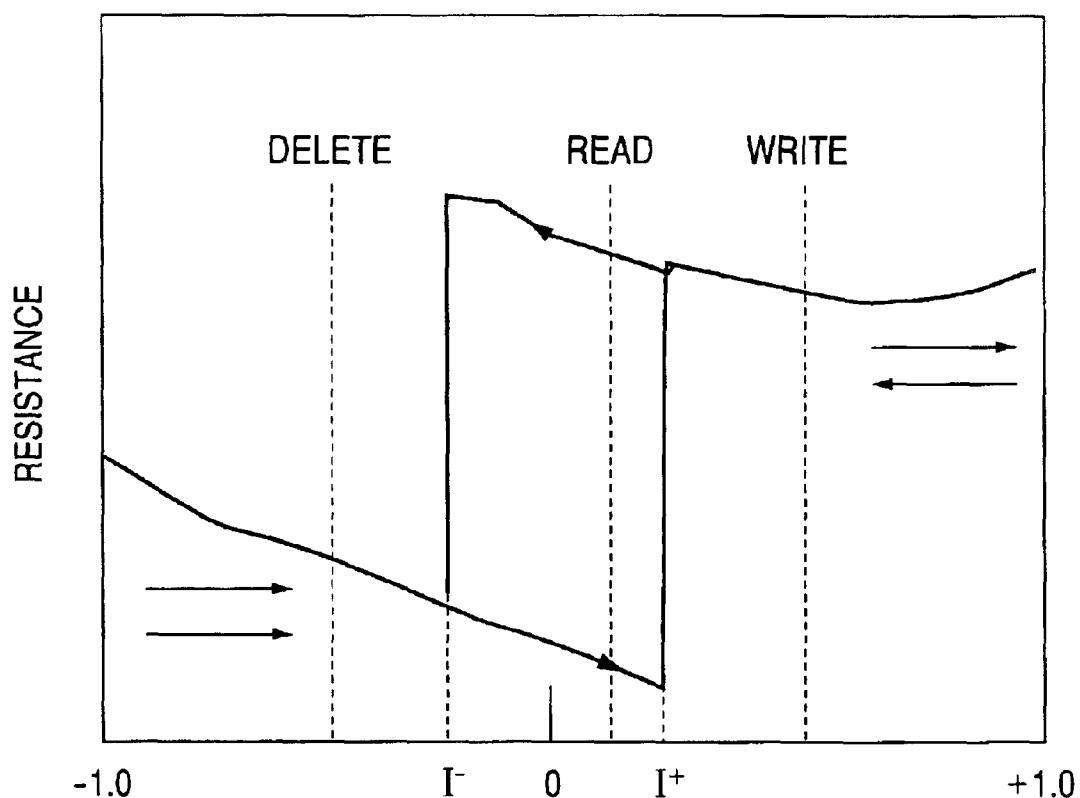
FIG. 2 is a diagram illustrating the principle of the writing/reading operation of the magnetic memory apparatus in FIG. 1A.

FIG. 2 is a diagram illustrating the principle of the writing/reading operation of the magnetic memory apparatus in FIGS. 1A to 1C. As shown in FIG. 1B, the conductive chip 105 provided at the distal end of the cantilever 102 is made in contact with a desired multilayered pillar and a voltage is applied there to let a current flow. A negative current is let to flow first and as the current value is changed in the positive direction from the negative direction, the direction of magnetization of one of the two magnetic layers 107 and 109 whose directions of magnetization have been in the same direction so far is shifted by 180 degrees at a given current value $I^+$ so that the directions of magnetization become antiparallel to each other. When the directions of magnetization become antiparallel to each other, the GMR effect increases the resistance. This state is a "1" state.

On the other hand, a positive current is let to flow first and as the current value is changed in the negative direction from the positive direction, the direction of magnetization of one of the two magnetic layers 107 and 109 whose directions of magnetization have been antiparallel to each other so far is shifted by 180 degrees at a given current value $I^-$ so that the directions of magnetization become the same. When the directions of magnetization become the same, the resistance decreases to the original value. This state is a "0" state. That is, the current-resistance curve has a so-called hysteresis as shown in FIG. 2.

In the case of a sample where the multilayered pillar in FIG. 1B had an area of a 20-nm square, the magnetic layers 107 and 109 were formed of CoFe and the nonmagnetic metal layer 108 was formed Cu, the value of $I^+$ was 80 $\mu$A and the value of $I^-$ was 150 $\mu$A. It is desirable that the absolute values of the currents should be set to be double the absolute values of $I^+$ and $I^-$ (+160 $\mu$A and -300 $\mu$A respectively in the case of a pillar with a 20-nm square) in performing the actual writing and deleting operations, while the current value I should be set to lie between $I^+$ and $I^-$ in performing the reading operation.

Figure 3A:
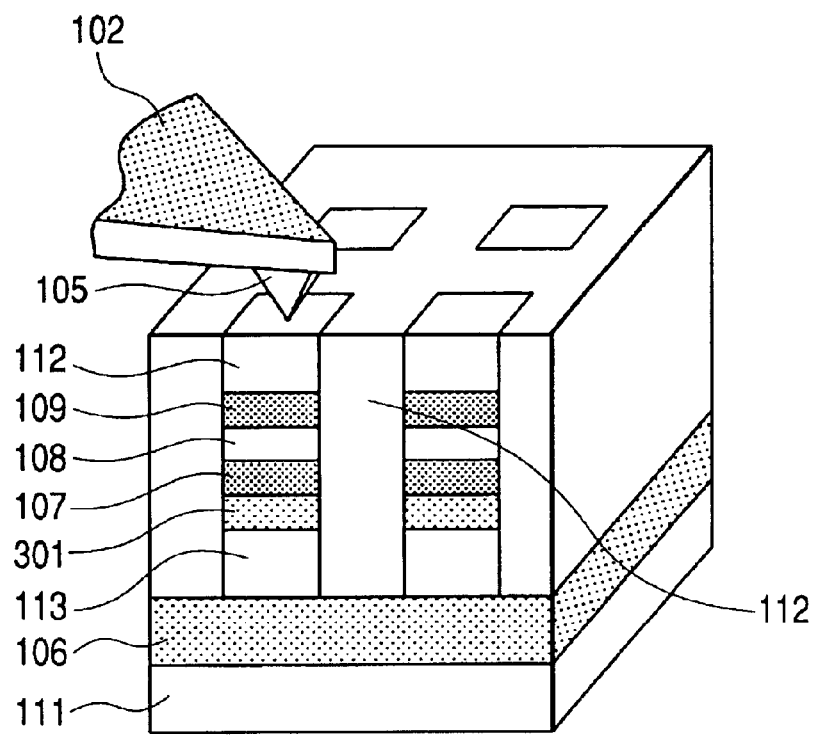
FIG. 3A is a perspective view showing a second example of the magnetic recording medium according to the invention.
Figure 3B:
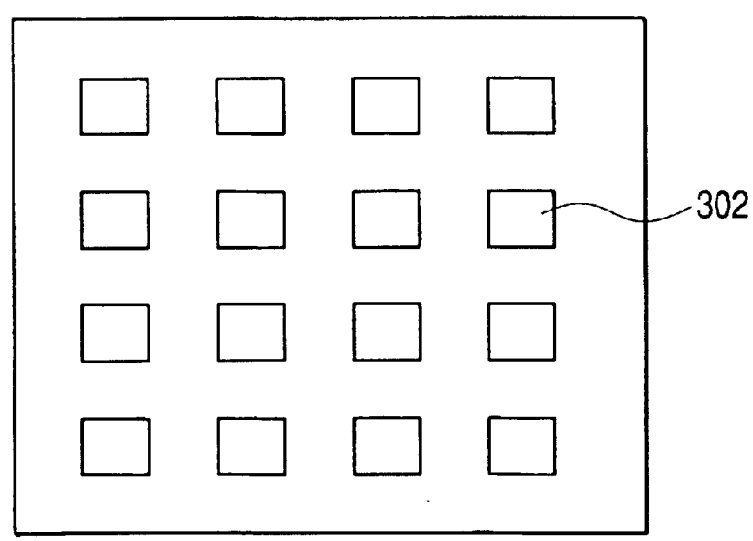
FIG. 3B is a plan view.

FIGS. 3A and 3B are diagrams showing the second example of the magnetic recording medium used in the invention. FIG. 3A is a perspective view showing one cantilever and a part of a magnetic recording medium, in enlargement, according to the embodiment, and FIG. 3B is a schematic plan view of the magnetic recording medium.

In the embodiment, an antiferromagnetic layer 301 which fixes the direction of magnetization of the first magnetic layer 107 to one direction is provided under the magnetic layer 107. It is suitable to use, for example, an alloy having Mn and Pt as the bases or an alloy having Mn and Ir as the bases for the antiferromagnetic layer.

Because the direction of magnetization of the first magnetic layer 107 is fixed to one direction in the embodiment, it is mainly the second magnetic layer 109 whose direction of magnetization changes, thus increasing the output of a read signal and the stability. Although the antiferromagnetic layer 301 is provided under the first magnetic layer 107 in FIGS. 3A and 3B, the antiferromagnetic layer 301 may be provided above the second magnetic layer 109 in which case even when the direction of magnetization of the second magnetic layer 109 is fixed to one direction, the same effect as provided by the case where the antiferromagnetic layer is provided under the first magnetic layer 107 can be attained.

Figure 4A:
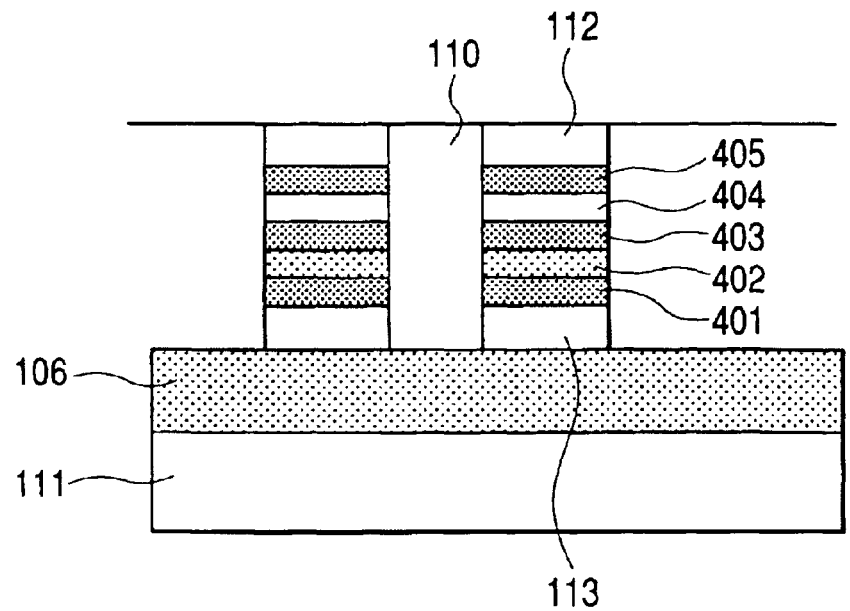
FIGS. 4A and 4B are diagrams showing a third example of the magnetic recording medium according to the invention.
Figure 4B:
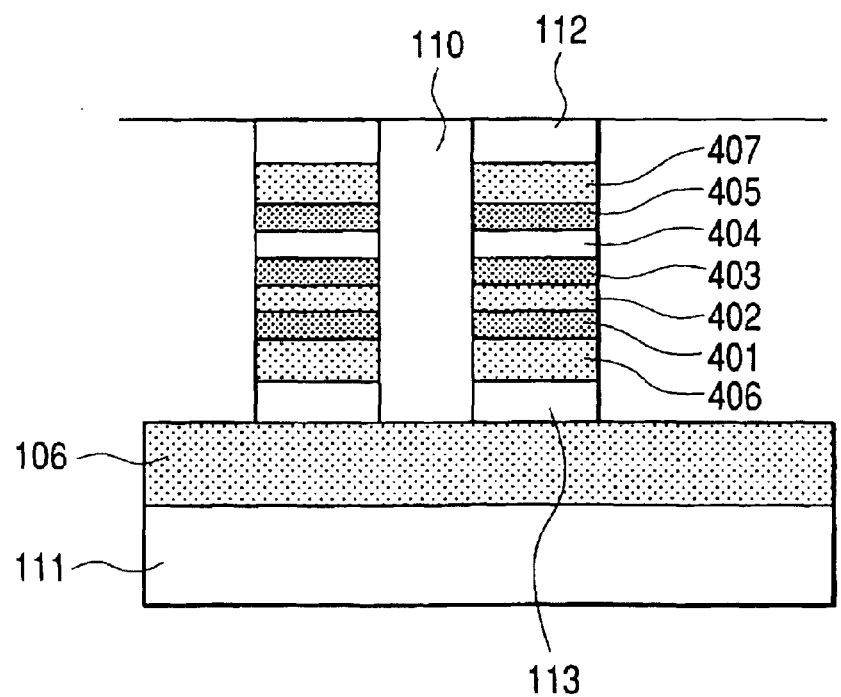

FIGS. 4A and 4B are diagrams showing the third example of the magnetic recording medium which is used in the invention. In FIG. 4A, a first magnetic layer 401, a nonmagnetic insulating layer 402, a second magnetic layer 403, a nonmagnetic metal layer 404 and a third magnetic layer 405 are laminated on a magnetic base metal 113. In this pillar-like nanostructure, the first magnetic layer 401, the nonmagnetic insulating layer 402 and the second magnetic layer 403 constitute a multilayered portion which demonstrates the TMR effect and the second magnetic layer 403, the nonmagnetic metal layer 404 and the third magnetic layer 405 constitute a multilayered portion which demonstrates the GMR effect. This embodiment is a multilayered pillar-like nanostructure which has the TMR effect and GMR effect combined together.

What is more, the second magnetic layer serves as both the magnetic layer of the TMR portion and the GMR portion in the embodiment. As the TMR effect is greater than the GMR effect and the resistance of the GMR portion is greater than the resistance of the GMR portion by the order of two to four digits, most of the change in resistance is obtained from the TMR portion.

In the case of the structure in FIG. 4A, to use a large change in the resistance of the TMR portion, the magnetic layer whose direction of magnetization is inverted by the supply of the current should be the second magnetic layer 403. To fulfill the requirement, the coercive force of the second magnetic layer 403 should be made lower than the coercive forces of the first and third magnetic layers and it is preferable to take measures, such as using a material with an extremely good soft magnetic characteristic like an alloy of Ni80Fe20 for the second magnetic layer and using a material with a relatively high coercive force like an alloy of Co and Fe for the third magnetic layer.

To meet the issue, antiferromagnetic layers 406 and 407 for fixing the direction of magnetization of the first and third magnetic layers are provided under the first magnetic layer 401 and above the third magnetic layer 405 in the structure in FIG. 4B. As the materials for the antiferromagnetic layers, the aforementioned alloy having Mn and Pt as the bases, alloy having Mn and Ir as the bases or the like is used. As this structure can fix the direction of magnetization of the first and third magnetic layers to one direction closely, various materials used in the first embodiment can be used for the magnetic layers. Therefore, the first magnetic layer 401 and the third magnetic layer 405 act as a fixed layer with its magnetization fixed and the magnetic layer 403 acts as a free layer whose direction of magnetization turns in accordance with an external magnetic field in the multilayered nanostructure in FIG. 4B.

The following will more specifically discuss the characteristics of the material structures with the pillar-like nanostructure taken as an example shown in FIG. 4B. Cu was used for the magnetic base metal 113, a PtMn alloy was used for the antiferromagnetic layer 406, a CoFe alloy was used for the first magnetic layer 401, Al oxide was used for the nonmagnetic insulating layer 402, a CoFe alloy was used for the second magnetic layer 403, Cu was used for the nonmagnetic metal layer 404, a CoFe alloy was used for the third magnetic layer 405, an IrMn alloy was used for the antiferromagnetic layer 407 and Cu was used for the upper cap layer 112.

The thickness of the Al oxide layer 402 that determines the resistance of this structure was set to 1.2 nm, the resistance of the multilayered structure extending from the cap layer 112 to the base metal 113 per area was about 4 $\Omega \cdot \mu m^2$. As this multilayered structure is formed into a pillar of a 20-nm square, the resistance of the actual pillar portion is 10 k$\Omega$.

When the current of 200 $\mu$A was let to flow in this multilayered pillar, the resistance became 12 k$\Omega$, increased by about 20%, and the writing state changed to "1" from "0". When the current of 200 $\mu$A was let to flow in the opposite direction, the resistance returned to the original 10 k$\Omega$ and the writing state changed to "0" from "1".

The power used in writing was 0.4 mW, significantly lower than the power (1 W or greater) needed in writing in the conventional hard disk apparatus or the power (several mW) per single memory cell in a 1-megabit MRAM that had been reported already. This apparent shows that the system of the embodiment demonstrates a large effect on power reduction.

The states of "0" and "1" were discriminated by supplying the current of 20 $\mu$A in the multilayered pillar from the conductive chip 105 and an output difference of 40 mV was detected between the "0" and "1" states. Although this value is smaller than the output of 100 mV of the dynamic random access memories available as products at present, it is still greater than the output (1 to 2 mV) from a magnetic head mounted in the hard disk apparatus by more than one digit and can be detected sufficiently.

Figure 5A:
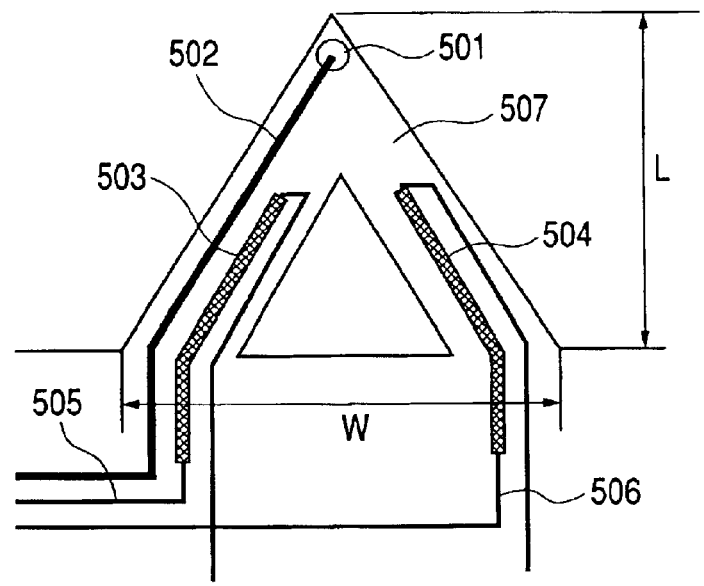
FIG. 5A is a plan view of a cantilever used in the invention.

FIG. 5A is a plan view of the cantilever that is used in the invention. "501" is a conductive chip (formed at the back of a cantilever) provided at the distal end of the cantilever, "502" is a line for leading the current to the conductive chip 501, "503" and "504" are piezoelectric elements 503 and 504 for detecting and controlling the attitude, "505" and "506" are lines for supplying a voltage to the piezoelectric elements 503 and 504 respectively and detecting the outputs thereof, and "507" is a lever portion whose middle portion is hollowed to improve the resonance frequency.

Figure 5B:
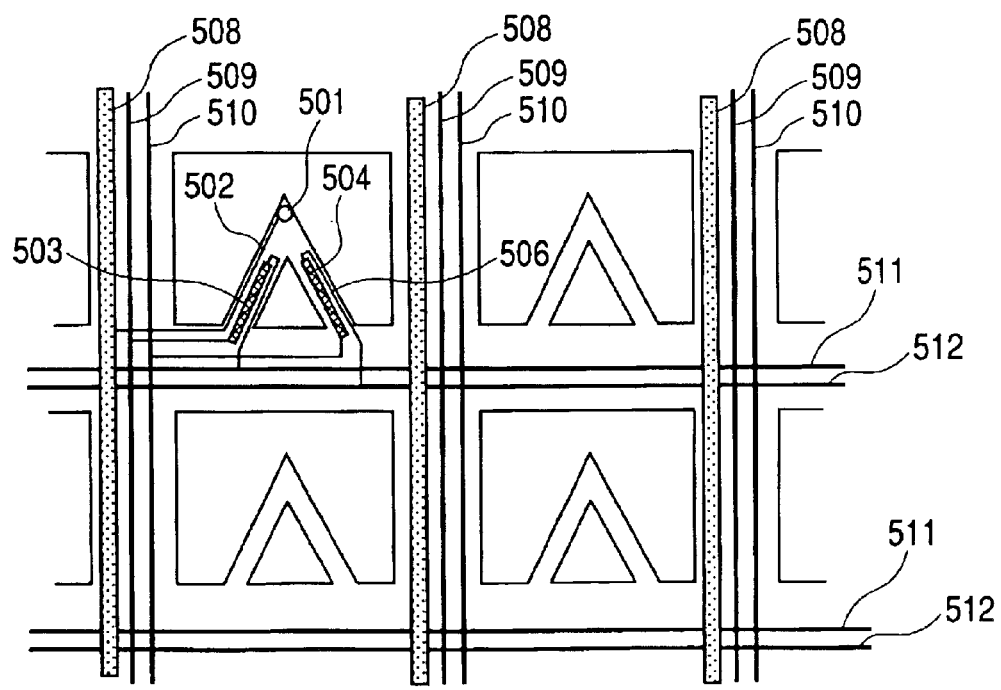
FIG. 5B is a diagram showing a part extracted from a cantilever array used in the invention.

FIG. 5B shows a part extracted from the cantilever array used in the invention. The cantilever array has an array of cantilevers each having the conductive chip 501 at its distal end in such a way as to be associated with a predetermined nanostructure in the multilayered nanostructures (multilayered pillars) discretely laid out as a recording medium.

In the diagram, "508" is a line provided to supply a current to the conductive chip provided at the distal end of the cantilever 507, and "509", "510", "511" and "512" are lines for applying a voltage to the piezoelectric elements 503 and 504. The lines 509 and 511 apply a voltage to the piezoelectric element 503 and one end of the line 505 is connected to the lines 509 and 511 orthogonal to each other.

The lines 510 and 512 apply a voltage to the piezoelectric element 504 and one end of the line 506 is connected to the lines 510 and 512 orthogonal to each other.

Hereinafter, the line 509 is referred to as a bit line 1, the line 510 is referred to as a bit line 2, the line 511 is referred to as a word line 1 and the line 512 is referred to as a word line 2. Although the lines drawn only for the single upper left cantilever in FIG. 5B, similar lines are laid out for all the other cantilevers.

Figure 6:
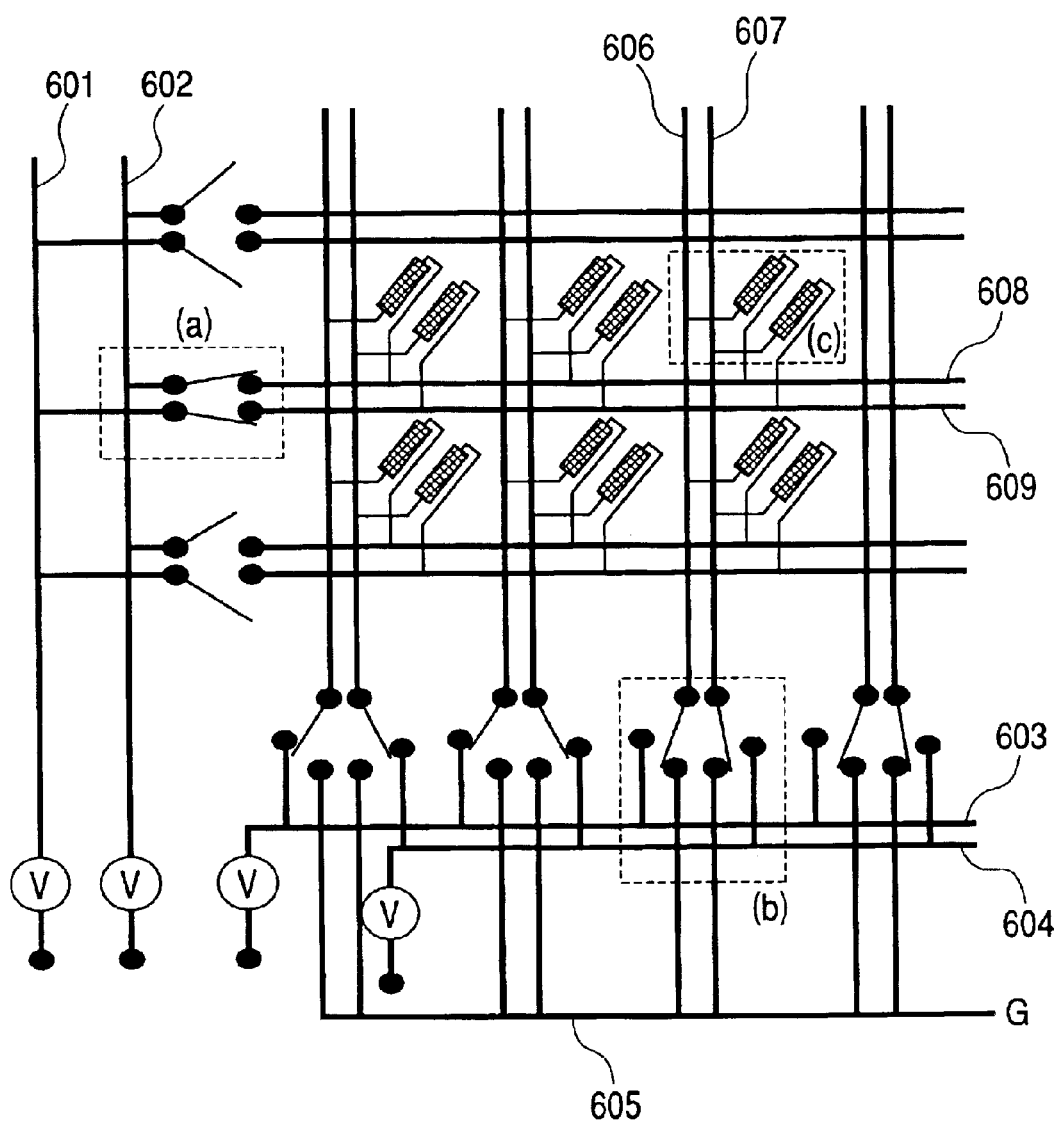
FIG. 6 is a diagram illustrating a system of selecting cantilevers which perform writing and reading operations.

FIG. 6 is a diagram illustrating a system of selecting desired cantilevers which perform writing and reading operations. Here, "601" is a line which supplies a voltage to the word line 1 (511 in FIG. 5B), "602" is a line which supplies a voltage to the word line 2 (512 in FIG. 5B), "603" is a line which supplies a voltage to the bit line 1 (509 in FIG. 5B), "604" is a line which supplies a voltage to the bit line 2 (510 in FIG. 5B), and "605" is a common ground.

In FIG. 6, only two of column select switches connected to the lines 601 and 602, which are indicated by (a) in the diagram, are set ON. This allows a potential V to be given only to the word lines 608 and 609 particularly selected.

Meanwhile, only two of row select switches connected to the lines 603 and 604, which are indicated by (b) in the diagram, are connected to the ground, and only the bit lines 606 and 607 particularly selected are set to the ground potential. The potential V is given to all of the other bit lines. This allows the potential difference V to be given only to two piezoelectric element indicated by (c) in the diagram. The potential difference cause the piezoelectric element to deform and the conductive chip of the cantilever on which the piezoelectric element is mounted contacts the desired multilayered pillar of the recording medium.

Then, the current is supplied to the desired, selected multilayered pillar via the line 502, so that the writing/reading operation is performed. The force to be applied to the cantilever to make a contact to the recording medium can be controlled by the potential V to be applied. In case where the attitude of the cantilever is deformed right or left by the upheavals of the recording medium, the attitude can be controlled by setting the potential to be applied to the lines 601 and 602 and the potential to be applied to the lines 603 and 604 not be equal to each other but in such a way as to have a difference to adjust the balance of the force to be applied to the cantilever 507.

The performance of the magnetic memory apparatus according to the invention will be discussed below. The time needed for such motion of the cantilever depends on the resonance frequency of the cantilever and the response speed of the piezoelectric element. In case where the length L and the width W of each cantilever are set to 5 $\mu$m in FIGS. 5A and 5B, for example, the response speed is equal to or lower than 0.1 $\mu$s, ensuring a sufficiently fast response. The speed needed for inverting the magnetization by the supply of the current from the conductive chip 501 provided at the distal end of the cantilever and the time needed to detect a read signal are both equal to or lower than 10 ns.

Therefore, the transfer rate of the magnetic memory apparatus of the invention is equal to or higher than 10 Mbps per single cantilever so that if 1000 cantilevers are laid out and parallel transfer is performed, the overall transfer rate of the apparatus becomes 10 Gbps, which ensures faster transfer than the existing magnetic disk apparatus. With regard to the recording capacity of the memory, in case where multilayered pillars each of a 20-nm square are laid out two-dimensionally at pitches of 20 nm as shown in FIGS. 1A to 1C, it is possible to achieve a large capacity of 100 GB, more than 100 times the capacity of flash memories available as products at present, on a medium chip of a 2.3-cm square.

Figure 7A:
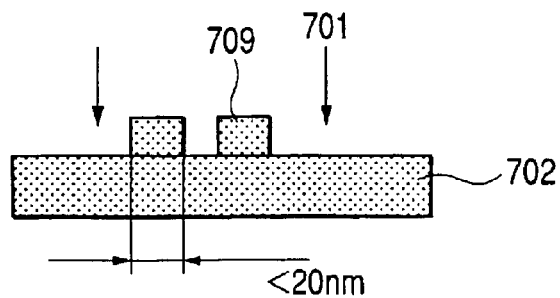
FIGS. 7A to 7D are process diagrams illustrating one example of a method of fabricating a patterned magnetic recording medium according to the invention.

FIGS. 7A to 7D are process diagrams illustrating one example of a method of fabricating a patterned magnetic recording medium according to the invention. First, as shown in FIG. 7A, an electron beam writing resist 709 is patterned into a desired shape using an electron beam writing scheme and a master 702 is patterned by ion milling or the like using Ar ions 701. The pattern to be formed is line patterns having a width of 5 nm to 30 nm laid out apart from one another at even pitches of 5 nm to 30 nm and horizontally and vertically in the orthogonal fashion, and is more preferably line patterns having a width of 20 nm or less.

Figure 7B:
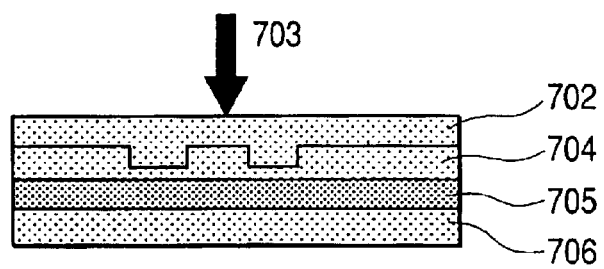

Subsequently, a multilayered film 705 which demonstrates the desired TMR effect and/or GMR effect and which becomes pillar-like nanostructure later is deposited on a conductive electrode layer 706, as shown in FIG. 7B. Then, an ultraviolet-cured type resist resin 704 is formed on the multilayered film 705 and the patterned master 702 is pressed against the resist resin 704 while irradiating ultraviolet rays 703 to transfer the pattern of the master onto the resist resin 704.

Figure 7C:
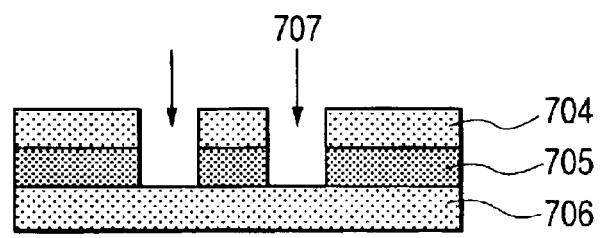

Next, as shown in FIG. 7C, the multilayered film 705 is etched using a reactive ion etching gas 707 to form multilayered pillar-like nanostructures laid out discretely, after which the resist resin 704 is removed.

Figure 7D:
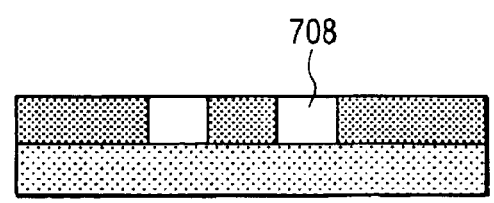

Finally, as shown in FIG. 7D, a non-magnetic insulating material 708 is deposited in such a way as to be filled between the pillar-like nanostructures and the medium is planarized by chemical mechanical polishing (CMP) which completes the fabrication of the medium. This method can fabricate a patterned recording medium in which multilayered pillar-like nanostructures each of a square of 5 nm to 30 nm, surrounded by the insulating material 708 and laid out at even pitches of 5 nm to 30 nm are formed on the conductive electrode layer.

As described above, the invention can provide a magnetic memory apparatus that has a large memory capacity and a super fast transfer rate, which are the merits of a hard disk apparatus, and a nanostructure and low power consumption, which are the merits of a semiconductor memory.

What is claimed is:

1. A magnetic memory apparatus comprising:

a patterned magnetic recording medium in which multilayered nanostructures each having a first magnetic layer, a nonmagnetic metal layer or a nonmagnetic insulating layer and a second magnetic layer laminated in that order on a conductive electrode layer formed on a substrate are laid out apart from one another at substantially even pitches; and a cantilever array in which cantilevers having conductive chips at distal ends are laid out in an array and apart from one another in such a way as to be associated with said nanostructures, whereby information is written or read by a current supplied from that one of said conductive chips which is associated with a desired one of said nanostructures as that conductive chip is put in contact with said desired nanostructure.

2. The magnetic memory apparatus according to claim 1, wherein the patterned magnetic recording medium includes pillar-like nanostructures each comprising a multilayered film showing a tunneling magnetoresistance effect or a multilayered film showing a giant magnetoresistance effect are surrounded by insulators in such a way as to be laid out apart from one another at substantially even pitches and are provided on a conductive electrode layer formed on a substrate.

3. A patterned magnetic recording medium in which pillar-like nanostructures each comprising a multilayered film having a lamination of a multilayered film showing a tunneling magnetoresistance effect and a multilayered film showing a giant magnetoresistance effect are surrounded by insulators in such a way as to be laid out apart from one another at substantially even pitches and are provided on a conductive electrode layer formed on a substrate.

4. A patterned magnetic recording medium in which pillar-like nanostructures each comprising a multilayered film showing a tunneling magnetoresistance effect or a multilayered film showing a giant magnetoresistance effect are surrounded by insulators in such a way as to be laid out apart from one another at substantially even pitches and are provided on a conductive electrode lever formed on a substrate, wherein said multilayered film showing said tunneling magnetoresistance effect comprises a multilayered film having a first magnetic layer, a nonmagnetic insulating layer and a second magnetic layer laminated in that order, said multilayered film showing said giant magnetoresistance effect comprises said second magnetic layer, a nonmagnetic metal layer and a third magnetic layer laminated in that order, and said second magnetic layer constituting said multilayered film showing said tunneling magnetoresistance effect serves as said second magnetic layer constituting said multilayered film showing said giant magnetoresistance effect.

5. The magnetic memory apparatus according to claim 2, where the patterned magnetic recording medium comprising means for fixing a direction of magnetization of one of magnetic layers constituting said multilayered film showing said tunneling magnetoresistance effect or said multilayered film showing said giant magnetoresistance effect to one direction.

6. The patterned magnetic recording medium according to claim 4, comprising means for fixing a direction of magnetization of said third magnetic layer to one direction.

7. The magnetic memory apparatus according to claim 5, wherein the means for fixing said direction of magnetization to one direction is an antiferromagnetic film.

8. A magnetic memory apparatus comprising:

a patterned magnetic recording medium in which nanostructures each comprising a multilayered film showing a tunneling magnetoresistance effect and/or a multilayered film showing a giant magnetoresistance effect are surrounded by insulators in such a way as to be laid out apart from one another at substantially even pitches and are provided on a conductive electrode layer formed on a substrate; and a cantilever array in which cantilevers having conductive chips at distal ends are laid out in an array and apart from one another in such a way as to be associated with said nanostructures, whereby information is written or read by a current supplied from that one of maid conductive chips which is associated with a desired one of said nanostructures as that conductive chip is put in contact with said desired nanostructure.

9. A magnetic recording method which uses a patterned magnetic recording medium in which nanostructures each comprising a multilayered film showing a tunneling magnetoresistance effect and/or a multilayered film showing a giant magnetoresistance effect are surrounded by insulators in such a way as to be laid out apart from one another at substantially even pitches and are provided on a conductive electrode layer formed on a substrate, and a cantilever array in which cantilevers having conductive chips at distal ends are laid out in an array and apart from one another in such a way as to be associated with said nanostructures, and writes digital information by inverting magnetization with 1 being a state where a resistance of said multilayered film is high while 0 is a state where said resistance is low, using a current supplied from that one of said conductive chips which is associated with a predetermined one of said nanostructures as that conductive chip is put in contact with said predetermined nanostructure.

10. A signal reading method which uses a patterned magnetic recording medium in which nanostructures each comprising a multilayered film showing a tunneling magnetoresistance effect and/or a multilayered film showing a giant magnetoresistance effect are surrounded by insulators in such a way as to be laid out apart from one another at substantially even pitches and are provided on a conductive electrode layer formed on a substrate, and a cantilever array in which cantilevers having conductive chips at distal ends are laid out in an array and apart from one another in such a way as to be associated with said nanostructures, end detects a level of a resistance of each multilayered pillar by putting that one of said conductive chips which is associated with a predetermined one of said nanostructures in contact with said predetermined nanostructure and causing a current whose value is smaller than that of a current by which magnetization of said multilayered film is inverted to flow from said conductive chip.

11. The magnetic memory apparatus according to claim 1, wherein a number of said multilayered nanostructures substantiality equals a number of said cantilevers having the conductive chips at the distal ends thereof, wherein each respective one of said multilayered nanostructures is associated with a predetermined differing respective one of said cantilevers, whereby information is written or read by a current supplied from that one of said conductive chips which is associated with a desired one of said nanostructures as that conductive chip is put in contact with said desired nanostructure.

12. The magnetic memory apparatus according to claim 8, wherein a number of said multilayered nanostructures substantially equals a number of said cantilevers having the conductive chips at the distal ends thereof, wherein each respective one of said multilayered nanostructures is associated with a predetermined differing respective one of said cantilevers, whereby information is written or read by a current supplied from that one of said conductive chips which is associated with a desired one of said nanostructures as that conductive chip is put in contact with said desired nanostructure.

13. The magnetic memory apparatus according to claim 9, wherein a number of said multilayered nanostructures substantially equals a number of said cantilevers having the conductive chips at the distal ends thereof, wherein each respective one of said multilayered nanostructures is associated with a predetermined differing respective one of said cantilevers, whereby information is written or read by a current supplied from that one of said conductive chips which is associated with a desired one of said nanostructures as that conductive chip is put in contact with said desired nanostructure.

14. The magnetic memory apparatus according to claim 10, wherein a number of said multilayered nanostructures substantially equals a number of said cantilevers having the conductive chips at the distal ends thereof, wherein each respective one of said multilayered nanostructures is associated with a predetermined differing respective one of said cantilevers, whereby information is written or read by a current supplied from that one of said conductive chips which is associated with a desired one of said nanostructures as that conductive chip is put in contact with said desired nanostructure.

* * * * *